United States Patent
Wu et al.

(10) Patent No.: US 6,608,373 B2
(45) Date of Patent: Aug. 19, 2003

(54) SUPPORT STRUCTURE FOR POWER ELEMENT

(75) Inventors: Kuo Liang Wu, Keelung (TW); Claude Pouet, Tours (FR)

(73) Assignee: Lite-On Semiconductor Corp., Keelung (TW)

( * ) Notice: Subject to any disclaimer, the term of this patent is extended or adjusted under 35 U.S.C. 154(b) by 12 days.

(21) Appl. No.: 09/968,902

(22) Filed: Oct. 3, 2001

(65) Prior Publication Data

US 2003/0062615 A1 Apr. 3, 2003

(51) Int. Cl.[7] .......................... H01L 23/48; H01L 23/52
(52) U.S. Cl. ............................................... 257/690
(58) Field of Search .................. 257/734, 712, 257/690, 691, 692, 693, 696, 678

(56) References Cited

U.S. PATENT DOCUMENTS 4,951,124 A * 8/1990 Sawaya ...................... 357/81
5,225,897 A * 7/1993 Reifel et al. ................ 257/787
6,320,258 B1 * 11/2001 Mangiagli et al. .......... 257/730

* cited by examiner

Primary Examiner—Kamand Cuneo
(74) Attorney, Agent, or Firm—Rosenberg, Klein & Lee

(57) ABSTRACT

A support structure of a power element includes a conductive mounting platform, a lead frame and a conductive lead. The conductive mounting platform includes an envelope engaging member, an interior conductive surface and an exterior conductive surface. The lead frame is with a first side and a second side. The first side is connected to at least one connecting element, which is connected to one side of the conductive mounting platform. The second side of the lead frame is with at least one conductive lead, including a first end and a second end that is connected with the second side of the lead frame so that the semiconductor device is secured on the interior conductive surface of the conductive mounting platform for establishing electrical connection. According to the aforementioned, the support structure can be easily assembled and manufactured.

1 Claim, 6 Drawing Sheets

SUPPORT STRUCTURE FOR POWER ELEMENT

FIELD OF THE INVENTION

The present invention relates to a support structure for a power element, and especially to a simple support structure, which can be easily manufactured so as to reduce costs greatly.

BACKGROUND OF THE INVENTION

U.S. Pat. No. 5,225,897 discloses a support structure for a power element including a conductive mounting platform, including one envelope engaging member, an interior conductive surface and an exterior conductive surface, for a semiconductor device which has a first electrical contact and a second electrical contact for positioning the semiconductor device on the interior conductive surface of the conductive mounting platform. The support structure also includes an envelope structure secured with the conductive mounting platform by the envelope engaging member. The envelope structure converges as a shell on the semiconductor device and the exterior conductive surface and the envelope engaging member are exposed for heat dissipation. The envelope engaging member includes an exterior wall portion of the envelope structure. The support structure further includes at least one conductive lead with a first end and a second end, wherein the first end is in contact with the second electrical contact of the semiconductor device and the second is located outside the exterior wall portion. A process for packaging the semiconductor device includes steps of forming a lower lead frame for connecting the conductive mounting platform and an upper frame. The conductive mounting platform extends from one side of the lower lead frame toward one side of the upper lead frame. At least one conductive lead is set with the upper lead frame and extends from the upper lead frame to one side of the lower lead frame for installing the semiconductor device to the conductive mounting platform and connecting both the semiconductor device and the conductive mounting platform electrically. The conductive lead is allowed to contact the electrical contacts of the semiconductor device. The envelope engaging member is bent to a predetermined degree, and the envelope structure is formed such that the envelope engaging member is convoluted so as to package the semiconductor device within a protection shell. The conductive mounting platform is then separated from the lower lead frame and the conductive wire separated from the upper lead frame.

But because the connecting element is set on the lower lead frame and the conductive lead is set on the upper lead frame for this kind of support structure, the upper lead frame and the lower lead frame are different in structure and cannot be manufactured efficiently, leading to huge expenditures. Furthermore, the bending of the envelope engaging element to the predetermined degree required, complicates the whole manufacturing procedure and also increases the total costs thereof.

SUMMARY OF THE INVENTION

Accordingly, the primary object of the present invention is to provide a support structure for a power element, wherein the connecting element and the conductive lead are formed at two opposite sides of a lead frame. Since only one lead frame is necessary, the defect of prior art with an upper lead frame and a lower lead frame is improved. Therefore, the structure of the present invention is simple, and can be easily manufactured so as to reduce cost greatly.

Another object of the present invention is to provide a support structure of a power element, wherein the envelope engaging member of the present invention is formed with a predetermined bending angle so that it is unnecessary to bend the envelope engaging member during manufacturing. Therefore, the manufacturing process is simplified and thus the expenditure can be lowered down greatly.

In accordance with the claimed invention, the present invention provides a support structure of a power element. A conductive mounting platform of the support structure is directly formed with an envelope engaging member, and at least one connecting element is connected to a first side of the conductive mounting platform and at least one conductive lead with a first end and a second end is set on a second side of the conductive mounting platform. The second end of the conductive lead is connected to the second side of the lead frame. A crossing wire is placed between the first end of the conductive lead and a first electrical contact of the semiconductor device.

These and other objectives of the present invention will no doubt become obvious to those of ordinary skill in the art after reading the following description of the preferred embodiment which is illustrated in the various figures and drawings.

DESCRIPTION OF PREFERRED EMBODIMENTS

Figure 1:
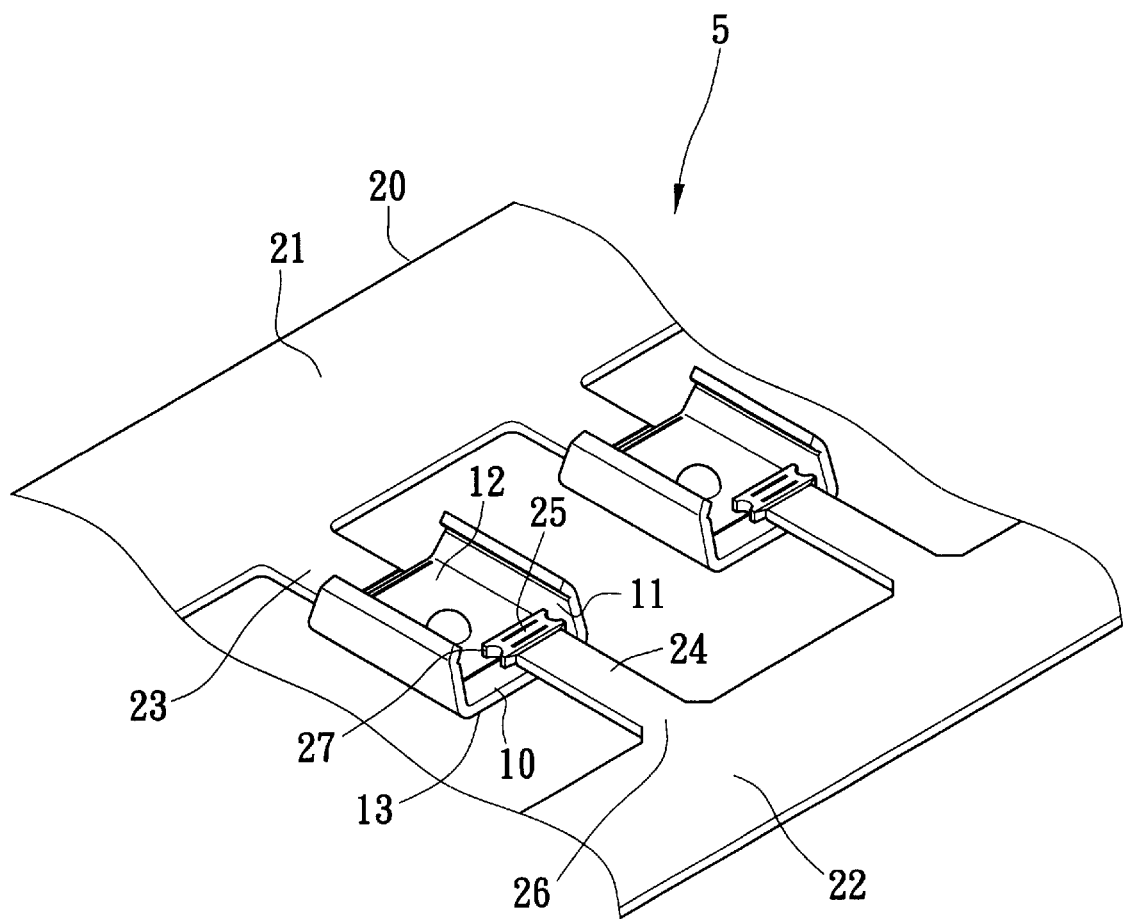
FIG. 1 is a schematic diagram of the support structure in the present invention.
Figure 2:
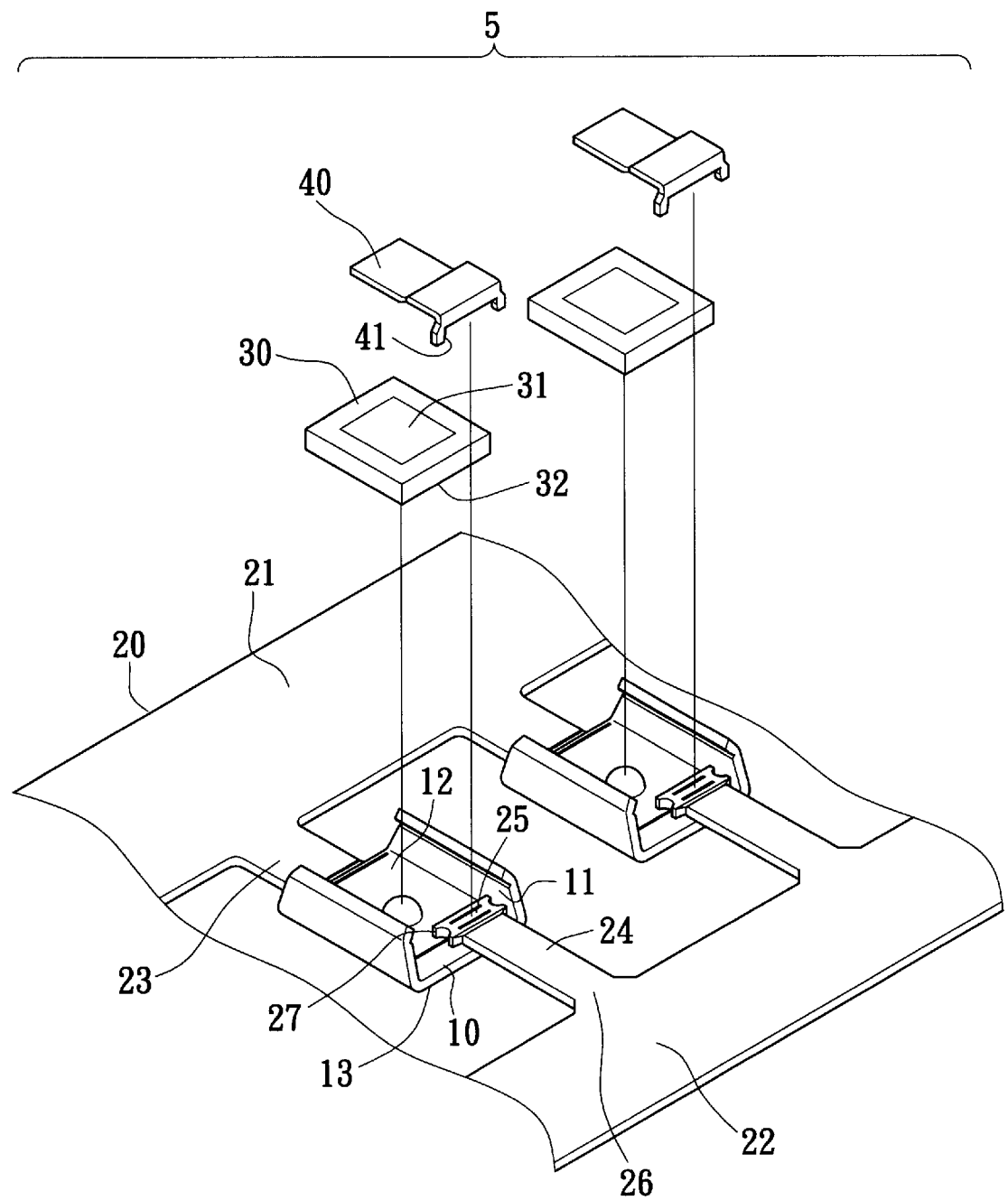
FIG. 2 is an exploded diagram of the support structure, the semiconductor device, and the crossing wire of the present invention.

With reference to FIG. 1, a support structure 5 of the present invention includes a conductive mounting platform 10 and a lead frame 20. The conductive mounting platform 10 is made of conductive materials and includes at least one envelope engaging member 11, an interior conductive surface 12 and an exterior conductive surface 13. In this embodiment, two envelope engaging members 11 are installed at two opposite conductive mounting platforms 10. The envelope engaging member 11 is formed with a predetermined bending angle. The lead frame 20 has a first side 21 and a second side 22, which are juxtaposed in parallel. The conductive mounting platform 10 is positioned between the first side 21 and the second side 22. The first side 21 is connected to at least one connecting element 23, extending toward the second side 22 for connecting the connecting element 23 with one side of the conductive mounting platform 10. The second side 22 of the lead frame 20 includes at least one conductive lead 24 with a first end 25 and a second end 26. The second end 26 of the conductive lead 24 is connected to the second side 22 of the lead frame 20. The conductive lead 24 extends toward the first side 21 from the second side 22 of the lead frame 20 so that the first end 25 of the conductive lead 24 is positioned above the conductive mounting platform 10 and is able to maintain a predetermined gap between the first end and the conductive mounting platform 10. Two positioning grooves 27 are installed at each of the two sides of the first end 25. Referring to FIGS. 2 to 5, the conductive mounting platform 10 is set for positioning the semiconductor device 30, including a first electrical contact 31 and a second electrical contact 32. The semiconductor device 30 is positioned on the interior conductive surface 12 of the conductive mounting platform 10 so that the exterior conductive surface 12 and the second electrical contact 32 are electrically connected with the connecting element 23.

The first end 25 of the conductive lead 24 is in contact with the first electrical contact 31 of the semiconductor device 30 through a crossing wire 40, which is made of conductive metal materials, and a positioning body 41 is formed downwards from two sides of one end of the crossing wire 40 for buckling with two positioning grooves 27 at two sides of the first end 25 of the conductive lead 24 in the lead frame 20 so that the crossing wire 40 is connected between the first end 25 of the conductive lead 24 and the first electrical contact 31 of the semiconductor device 30.

Figure 3:
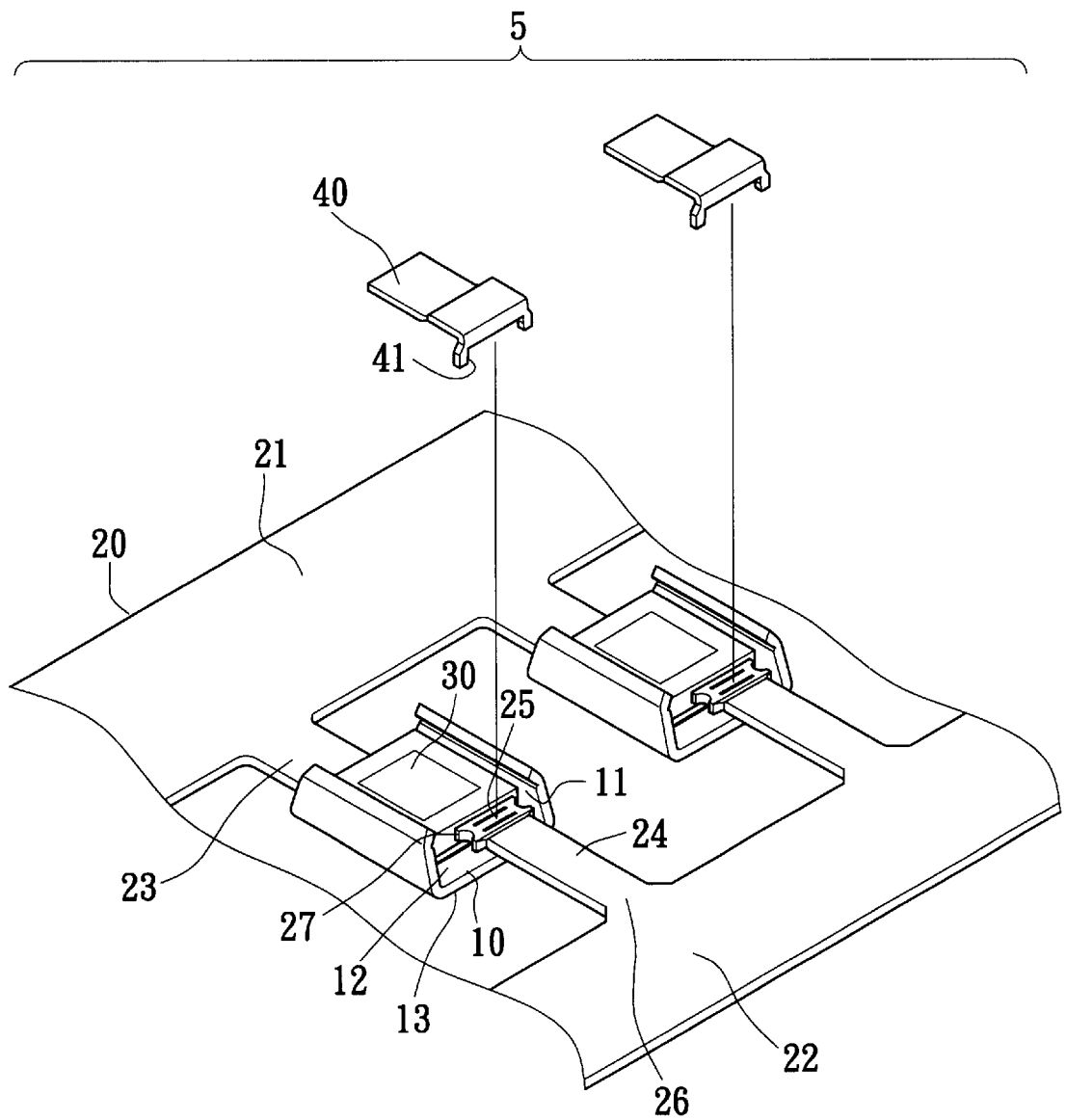
FIG. 3 is a schematic diagram of positioning the semiconductor device on the support structure of the present invention.
Figure 4:
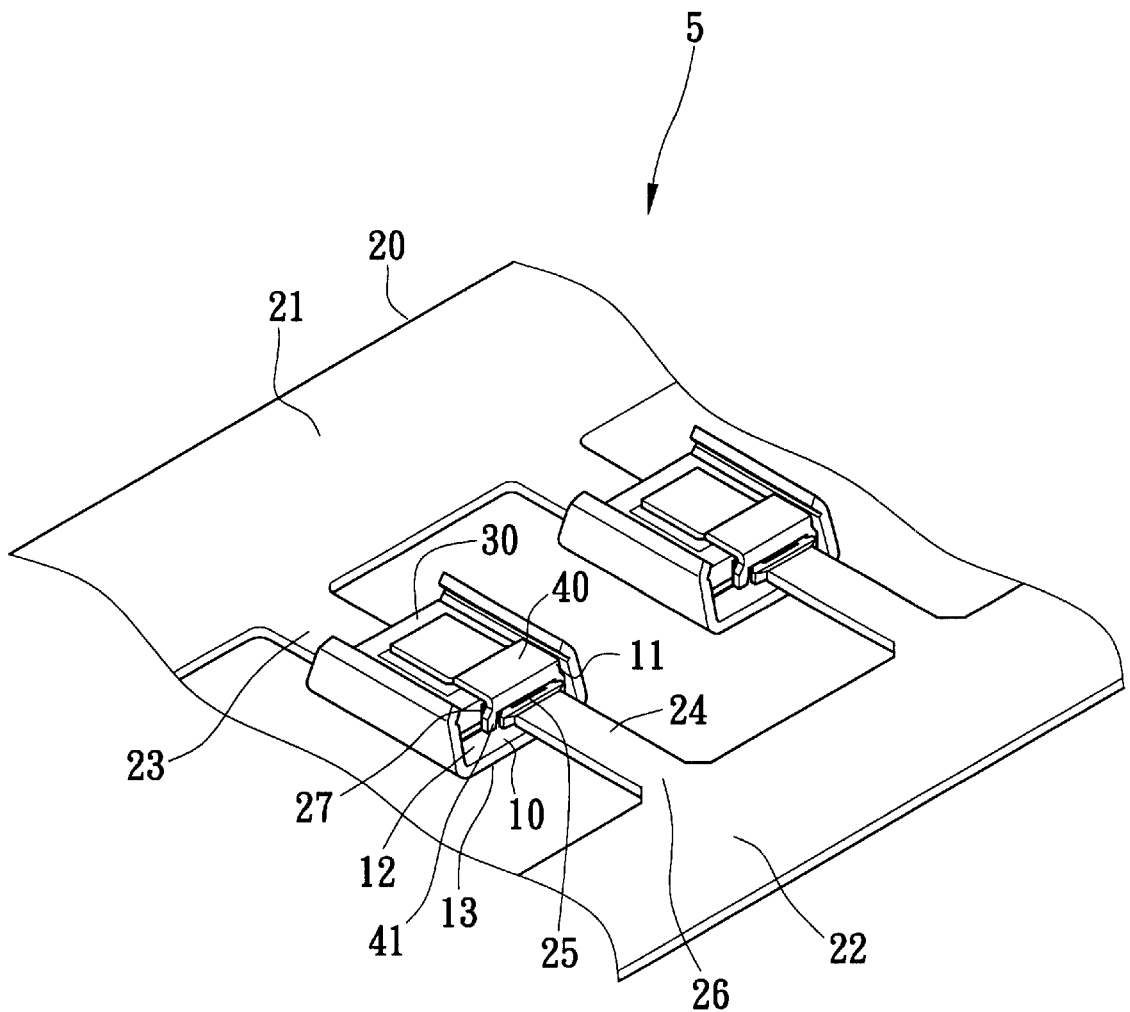
FIG. 4 is a schematic diagram of positioning the semiconductor device and the crossing wire on the support structure of the present invention.
Figure 5:
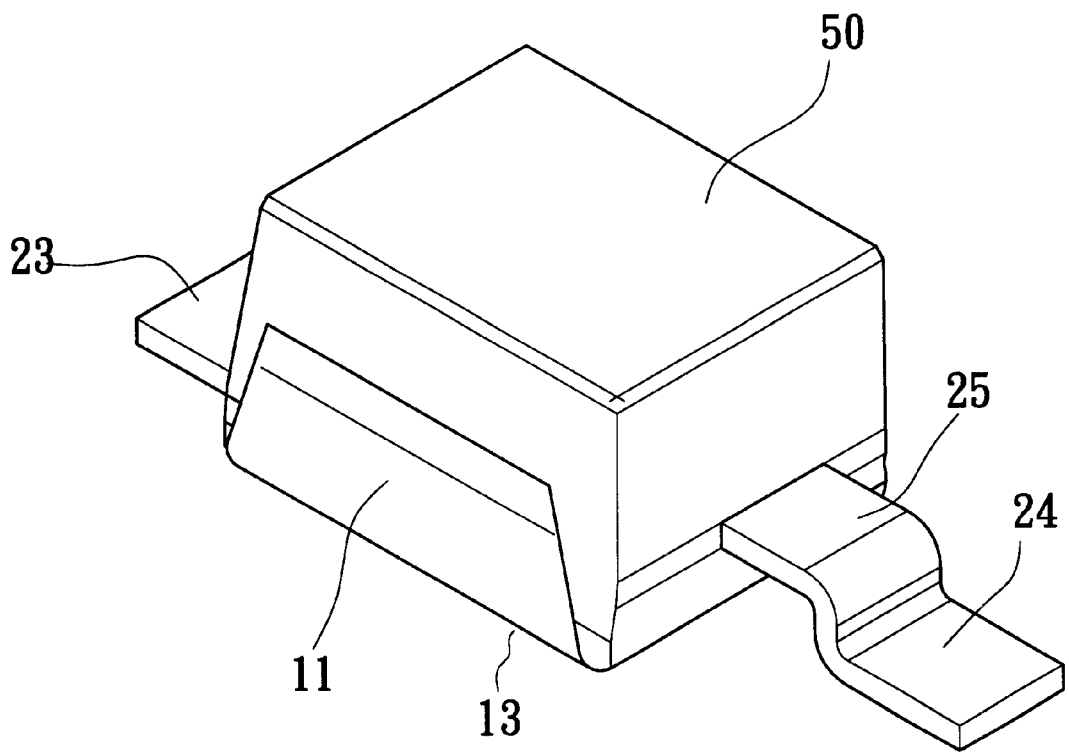
FIG. 5 is a schematic diagram for packaging a power element according to the present invention.

Please refer to FIG. 5 in conjunction with FIG. 3, an envelope structure 50 is packaged on the conductive mounting platform 10 and the semiconductor device 30. The envelope structure 50 is secured on the conductive mounting platform 10 by the envelope engaging member 11 and converges as a shell on the semiconductor device 30. The exterior conductive surface 13 and the envelope engaging member 11 are exposed out of the envelope structure 50 for heat dissipation. Under this kind of configuration, the envelope engaging member 11 will be a portion of an exterior wall of the envelope structure 50, and the second end 25 of the conductive lead 24 and the connecting element 23 are also outside of the envelope structure 50 so that to form a power element.

Figure 6:
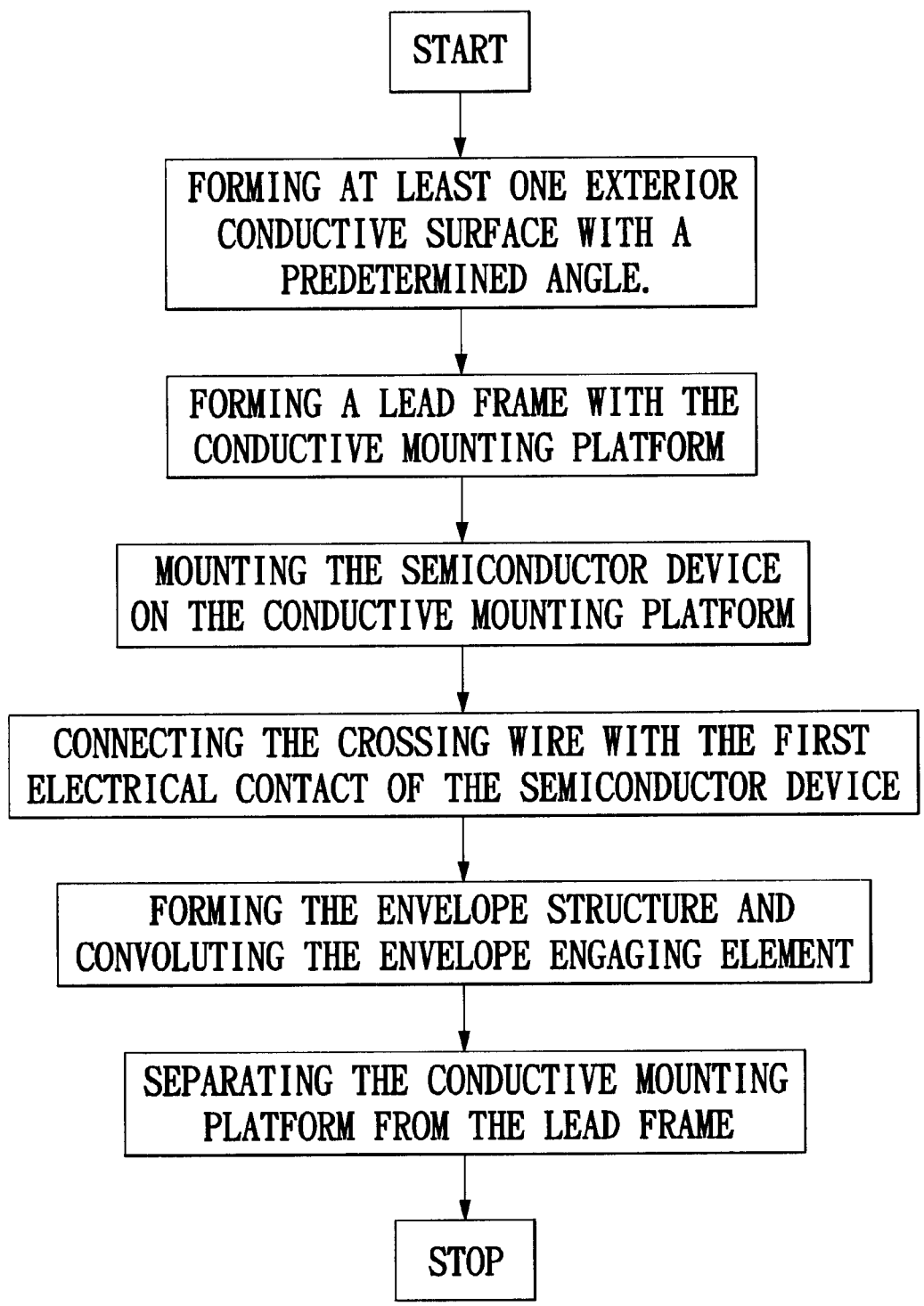
FIG. 6 is flow chart of the manufacturing process of the present invention.

Referring to FIG. 6, the method for packaging a power element according to the present invention includes steps as follows:

(a) forming at least one exterior conductive surface with a predetermined angle, which is corresponding to the conductive surface of the conductive mounting platform;

(b) forming a lead frame with the conductive mounting platform, which extends from the connecting element on the first side of the lead frame to corresponding second side of it and the conductive lead set on the second side of the lead frame extends to the first side of the lead frame;

(c) mounting the semiconductor device on the conductive mounting platform to establish electrical connection between both of them;

(d) connecting the crossing wire with the first electrical contact of the semiconductor device through the contact surface of the conductive lead of the lead frame;

(e) forming the envelope structure and convoluting the envelope engaging element thus the semiconductor device is packaged within a the envelope structure, the exterior conductive surface, the connecting element, and the conductive lead are exposed outside of the envelope structure so as to dissipate heat, and the envelope engaging element is a part of the outside portion of the envelope structure;

(f) separating the conductive mounting platform from the lead frame; in other words, separating the connecting element and the conductive lead from the lead frame 24.

In the present invention, the connecting element and the conductive lead are formed at two opposed sides of the lead frame 20. As this result, only one lead frame is needed and the defect of prior art with an upper lead frame and a lower lead frame is improved. Therefore, the structure of the present invention is simple, and can be easily manufactured so as to reduce cost greatly. Moreover, the envelope engaging member 11 of the present invention is formed with a bending predetermined angle. After that, it is unnecessary to bend the envelope engaging member during the manufacturing process. Therefore, the manufacturing process according to the present invention, whose costs are down greatly, is simpler and easier than that of the prior art.

It will also be appreciated that other modifications and variations may be made to the embodiments as described and illustrated within the scope of the present application as defined in the following claims.

What is claimed is:

1. A support structure for a power element, comprising:

a conductive mounting platform with an envelope engaging element; an interior conductive surface, and an outer conductive surface;

a lead frame with a first side and a second side, the first side including at least one connecting element connected to one side of the conductive mounting platform; the conductive mounting platform being set between the first side and the second side of the lead frame the second side of the lead frame including at least one conductive lead extending from the second side of the lead frame and having a first end and a second end;

a semiconductor device positioned on the interior conductive surface of the conductive mounting platform, the semiconductor device including a first electrical contact and a second electrical contact for respectively establishing electrical connections between the second electrical contact and the interior conductive surface of the conductive mounting platform; and a crossing wire installed between the first end of the conductive lead and the first electrical contact of the semiconductor device, the first conductive lead having two positioning grooves respectively formed on two sides of the first end of the conductive lead, the crossing wire having a positioning body formed on each of two sides of one end thereof, each positioning body extending downwardly for buckling with a respective one of the positioning grooves on each of the two sides of the first end of the conductive lead.

* * * * *